(12) United States Patent
Igarashi

(10) Patent No.: US 12,557,705 B2
(45) Date of Patent: Feb. 17, 2026

(54) SEMICONDUCTOR UNIT

(71) Applicant: FUJI ELECTRIC CO., LTD., Kawasaki (JP)

(72) Inventor: Seiki Igarashi, Saitama (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 397 days.

(21) Appl. No.: 18/189,766

(22) Filed: Mar. 24, 2023

(65) Prior Publication Data

US 2023/0343756 A1     Oct. 26, 2023

(30) Foreign Application Priority Data

Apr. 22, 2022 (JP) ................................. 2022-071134

(51) Int. Cl.
| | | |
|---|---|---|
| H01L 25/16 | (2023.01) | |
| H01L 23/00 | (2006.01) | |
| H01L 23/495 | (2006.01) | |
| H01L 23/66 | (2006.01) | |
| H01L 25/07 | (2006.01) | |

(52) U.S. Cl.
CPC ...... H01L 25/072 (2013.01); H01L 23/49562 (2013.01); H01L 23/66 (2013.01); H01L 24/32 (2013.01); H01L 25/16 (2013.01); *H01L 2224/32245* (2013.01)

(58) Field of Classification Search
CPC ..................... H01L 24/32; H01L 25/16; H01L 2224/32245; H01L 23/5222; H01L 23/5227; H01L 23/50; H01G 4/228; H01G 4/38; H01G 4/40; H02M 1/088; H02M 1/44; H02M 7/5387; H02M 7/003; H05K 7/14329
See application file for complete search history.

(56) References Cited

U.S. PATENT DOCUMENTS 6,002,183 A * 12/1999 Iversen ................. H01L 25/162
257/691
2021/0143747 A1 5/2021 Sano et al.

FOREIGN PATENT DOCUMENTS

| EP | 3203625 A1 | 8/2017 |
|---|---|---|
| JP | 2006-203974 A | 8/2006 |

(Continued)

OTHER PUBLICATIONS

Reiner John, "Reduction in Weight of Inverter by 50%", Fig. 4, Nikkei xTECH, Apr. 6, 2017; with partial translation.

*Primary Examiner* — Tucker J Wright

(74) *Attorney, Agent, or Firm* — Rabin & Berdo, P.C.

(57) ABSTRACT

A laminated wiring has a first conductor which connects first terminals of one or more capacitors and each positive terminal of a plurality of semiconductor modules, a second conductor which connects second terminals of the one or more capacitors and each negative terminal of the plurality of semiconductor modules, and an insulator. Slits are cut in at least one of the first conductor and the second conductor (in both of them in the example of FIG. 1). By doing so, among the plurality of semiconductor modules, a variation in the total of respective inductance values between respective first terminals and one positive terminal closest to the respective first terminals and respective inductance values between respective negative terminals to one second terminal closest to the respective negative terminals becomes smaller than or equal to 10 nH.

9 Claims, 12 Drawing Sheets

(56) References Cited

FOREIGN PATENT DOCUMENTS

| | | |
|---|---|---|
| JP | 2015-149828 A | 8/2015 |
| JP | 2016-174503 A | 9/2016 |
| JP | 2017-139915 A | 8/2017 |
| JP | 2020-156310 A | 9/2020 |
| JP | 2021-019383 A | 2/2021 |
| WO | 2016/125673 A1 | 8/2016 |

* cited by examiner

SEMICONDUCTOR UNIT

CROSS-REFERENCE TO RELATED APPLICATION

This application is based upon and claims the benefit of priority of the prior Japanese Patent Application No. 2022-071134, filed on Apr. 22, 2022, the entire contents of which are incorporated herein by reference.

BACKGROUND OF THE INVENTION

1. Field of the Invention

The embodiments discussed herein relate to a semiconductor unit including a plurality of semiconductor modules connected in parallel.

2. Background of the Related Art

In order to improve current-carrying capacity, there are provided semiconductor units in which a plurality of semiconductor modules each including switching elements, such as insulated gate bipolar transistors (IGBTs) or power metal oxide semiconductor field effect transistors (MOSFETs), are connected in parallel.

Furthermore, a technique for connecting a plurality of semiconductor modules in parallel by the use of a laminated wiring including a first conductor and a second conductor was proposed. For example, a positive terminal of each semiconductor module is connected to the first conductor connected to one of the two terminals of a capacitor which functions as a direct-current power supply and a negative terminal of each semiconductor module is connected to the second conductor connected to the other of the two terminals of the capacitor. Output terminals of the plurality of semiconductor modules are electrically connected to an output terminal of a semiconductor unit.

Formerly, a technique for adopting a structure, for an inverter unit including a plurality of semiconductor switches connected in parallel, in which an output wiring is arranged opposite an input wiring and in which current paths are made equal to the longest current path to prevent a current imbalance was proposed (see, for example, Japanese Laid-open Patent Publication No. 2016-174503). With this structure, however, the current paths become longer and a wiring inductance increases. As a result, a surge voltage at the time of switching increases. Moreover, because a path along which a high-frequency current flows at the time of switching becomes longer, electromagnetic interference (EMI), such as radiation noise, also occurs.

Formerly, cutting slits in a bus bar for the purpose of eliminating a current imbalance in a plurality of semiconductor modules connected in parallel was proposed (see, for example, Japanese Laid-open Patent Publication No. 2017-139915 or Japanese Laid-open Patent Publication No. 2006-203974). Furthermore, connecting emitter electrodes of a plurality of semiconductor chips connected in parallel to the same conductive member via terminals individually arranged is known (see, for example, Japanese Laid-open Patent Publication No. 2020-156310).

In addition, a technique for locating a capacitor module around a rotation axis and arranging a plurality of semiconductor modules on an outer peripheral side surface of the capacitor module in the direction of the periphery is known regarding how to arrange a plurality of semiconductor modules (see, for example, Japanese Laid-open Patent Publication No. 2021-019383). Moreover, a technique for arranging a plurality of semiconductor modules like concentric circles around a cylindrical case in which a hole for inserting, for example, a shaft of a motor is made is known (see, for example, International Publication Pamphlet No. WO 2016-125673).

Furthermore, a technique for detecting a circulating current running through a wiring connected to emitters of a plurality of switching elements connected in parallel and controlling on-off of each switching element by a gate drive circuit on the basis of a detection result is known (see, for example, Japanese Laid-open Patent Publication No. 2015-149828).

With the technique for connecting a plurality of semiconductor modules in parallel by connecting a capacitor and positive and negative terminals of each semiconductor module by the use of a laminated wiring, a wiring inductance between the capacitor and positive and negative terminals of each semiconductor module is unequal. Furthermore, a wiring inductance between an output terminal of each semiconductor module and the output terminal of the semiconductor unit is unequal. As a result, apportionment of a current at the time of switching is also unequal.

SUMMARY OF THE INVENTION

According to an aspect, there is provided a semiconductor unit, including: one or more capacitors each having a first capacitor terminal and a second capacitor terminal; a plurality of semiconductor modules each having a positive terminal, a negative terminal, and a first output terminal; a laminated wiring having a first conductor which connects the first capacitor terminal of each of the one or more capacitors to the plurality of positive terminals, a second conductor which connects the second capacitor terminal of each of the one or more capacitors to the plurality of negative terminals, and an insulator which is disposed between the first conductor and the second conductor and insulates the first conductor and the second conductor from each other, the laminated wiring having a plurality of slits in one of the first conductor and the second conductor so that a variation in a total of first and second inductance values among the plurality of semiconductor modules is smaller than or equal to 10 nH, the first inductance values being respective inductance values between each first capacitor terminal of the one or more capacitors and one positive terminal that is closest to each first capacitor terminal, the second inductance values being respective inductance values between each one of the plurality of negative terminals and one second capacitor terminal that is closest to each one of the plurality of negative terminals; and an output wiring having a plurality of connecting portions respectively connected to a respective one of the first output terminals of the plurality of semiconductor modules, a second output terminal and an intermediate portion electrically connecting the plurality of connecting portions to the second output terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described by reference to the accompanying drawings. In the following description, an "upside," a "downside," a "front surface," and a "back surface" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction.

First Embodiment

Figure 1:
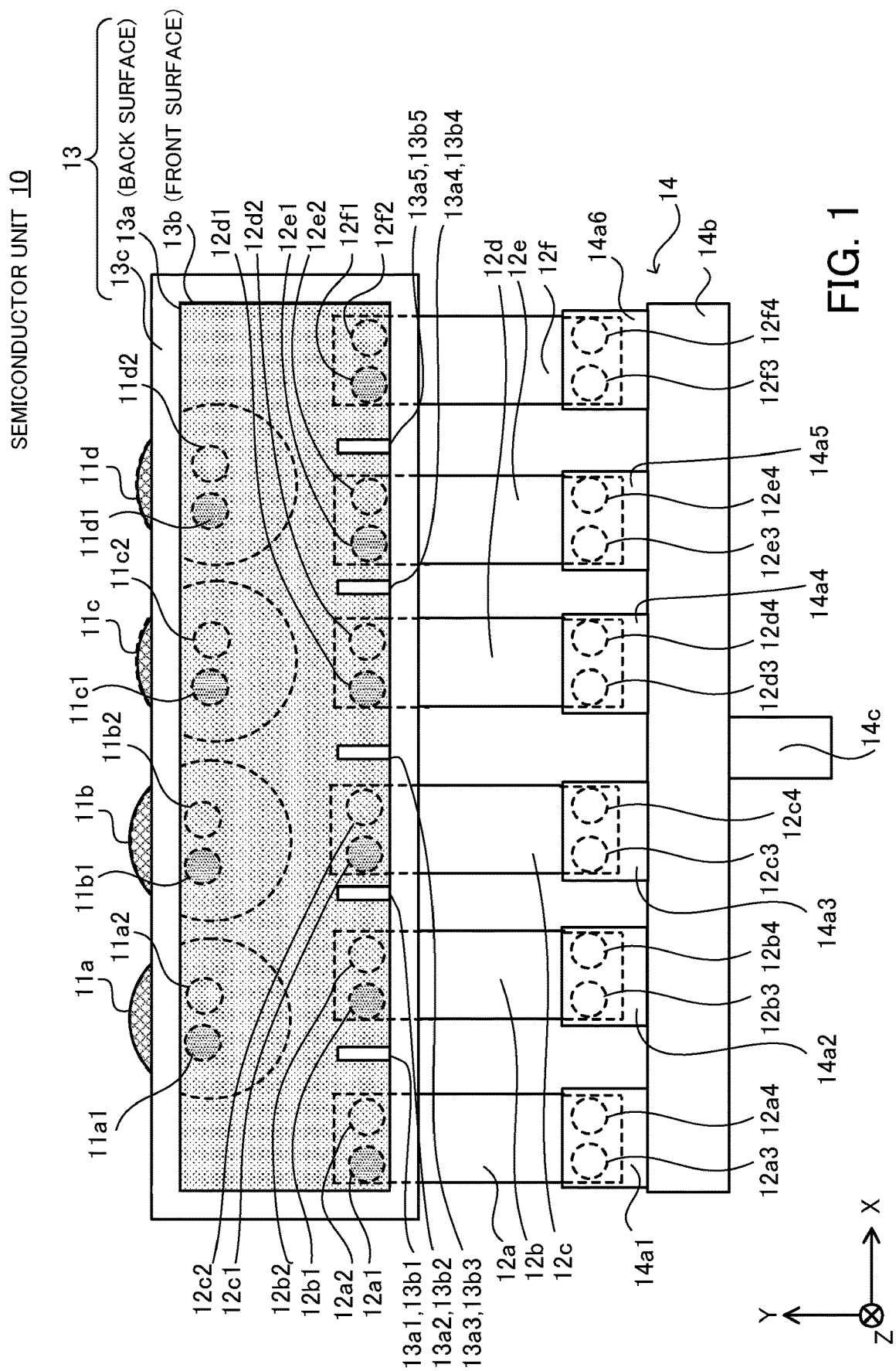
FIG. 1 is a plan view of a semiconductor unit according to a first embodiment.

FIG. 1 is a plan view of a semiconductor unit according to a first embodiment.

A semiconductor unit 10 includes one or more capacitors (four capacitors 11a, 11b, 11c, and 11d in the example of FIG. 1) each having a first terminal and a second terminal. Each of the capacitors 11a, 11b, 11c, and 11d functions as a direct-current power supply. Hereinafter the first terminals will be indicated by terminals 11a1, 11b1, 11c1, and 11d1. The second terminals will be indicated by terminals 11a2, 11b2, 11c2, and 11d2.

Furthermore, the semiconductor unit 10 includes a plurality of semiconductor modules (six semiconductor modules 12a, 12b, 12c, 12d, 12e, and 12f in the example of FIG. 1) each having a positive terminal, a negative terminal, and a first output terminal. In FIG. 1, positive terminals of the semiconductor modules 12a through 12f are positive terminals 12a1, 12b1, 12c1, 12d1, 12e1, and 12f1, respectively, and negative terminals of the semiconductor modules 12a through 12f are negative terminals 12a2, 12b2, 12c2, 12d2, 12e2, and 12f2, respectively.

In addition, in the example of FIG. 1, each of the semiconductor modules 12a through 12f has two first output terminals. First output terminals of the semiconductor module 12a are first output terminals 12a3 and 12a4, first output terminals of the semiconductor module 12b are first output terminals 12b3 and 12b4, and first output terminals of the semiconductor module 12c are first output terminals 12c3 and 12c4. Furthermore, first output terminals of the semiconductor module 12d are first output terminals 12d3 and 12d4, first output terminals of the semiconductor module 12e are first output terminals 12e3 and 12e4, and first output terminals of the semiconductor module 12f are first output terminals 12f3 and 12f4.

As will be described in FIG. 3, each of the semiconductor modules 12a through 12f has a structure in which IGBTs that are an example of a switching element are connected in series and in which a diode is connected in inverse parallel with each switching element. The number of semiconductor modules is not limited to six and may be two or more.

In addition, the semiconductor unit 10 includes a laminated wiring 13. The laminated wiring 13 has a first conductor 13a on the back surface, a second conductor 13b on the front surface, and an insulator 13c between the first conductor 13a and the second conductor 13b with an area on the X-Y plane which is larger than that of the first conductor 13a and the second conductor 13b. The laminated wiring 13 is located over the capacitors 11a through 11d. The first conductor 13a connects the terminals 11a1 through 11d1 of the capacitors 11a through 11d and the positive terminals 12a1 through 12f1. The second conductor 13b connects the terminals 11a2 through 11d2 of the capacitors 11a through 11d and the negative terminals 12a2 through 12f2. The insulator 13c is located between the first conductor 13a and the second conductor 13b and the first conductor 13a and the second conductor 13b are insulated with the insulator 13c.

The first conductor 13a and the second conductor 13b are made of a material such as copper or aluminum. A polyethylene terephthalate (PET) film, a resin material such as glass epoxy resin, or the like is used as the insulator 13c.

Slits are cut in at least one of the first conductor 13a and the second conductor 13b so that variations in the total of first inductance values from the terminals 11a1 through 11d1 to the positive terminals 12a1 through 12f1 nearest the terminals 11a1 through 11d1 and second inductance values from the negative terminals 12a2 through 12f2 to the terminals 11a2 through 11d2 nearest the negative terminals 12a2 through 12f2 will be smaller than or equal to 10 nH among the semiconductor modules 12a through 12f.

Figure 2:
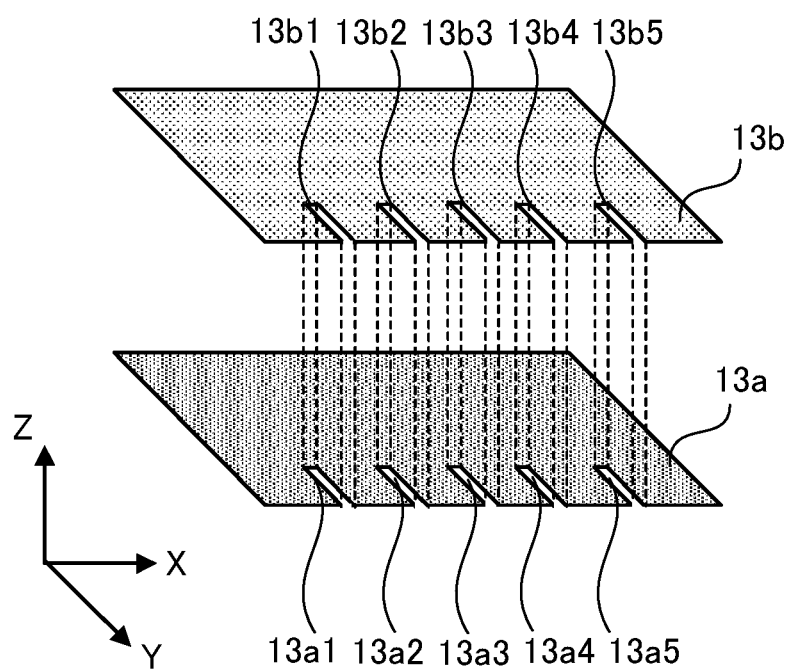
FIG. 2 is a perspective view of an example of slits cut in a first conductor and a second conductor.

FIG. 2 is a perspective view of an example of slits cut in the first conductor and the second conductor. In the example of FIG. 1 and FIG. 2, slits are cut in both of the first conductor 13a and the second conductor 13b and the slits cut in the second conductor 13b are superimposed over the slits cut in the first conductor 13a in plan view. As illustrated in FIG. 2, slits 13a1, 13a2, 13a3, 13a4, and 13a5 are cut in the first conductor 13a and slits 13b1, 13b2, 13b3, 13b4, and 13b5 are cut in the second conductor 13b.

In the example of FIG. 1, each of the slits 13a1 through 13a5 and 13b1 through 13b5 is cut in plan view between a positive terminal and a negative terminal of semiconductor modules adjacently to each other in the X direction.

Furthermore, the semiconductor unit 10 includes an output wiring 14. The output wiring 14 has connecting portions 14a1, 14a2, 14a3, 14a4, 14a5, and 14a6 connected to the first output terminals 12a3 through 12f3 and 12a4 through 12f4 of the semiconductor modules 12a through 12f, respectively, an intermediate portion 14b, and a second output terminal 14c.

For example, the first output terminals 12a3 and 12a4 of the semiconductor module 12a are connected to the connecting portion 14a1 and the first output terminals 12b3 and 12b4 of the semiconductor module 12b are connected to the connecting portion 14a2. The intermediate portion 14b electrically connects the connecting portions 14a1 through 14a6 and the second output terminal 14c. The second output terminal 14c corresponds to an output terminal of the semiconductor unit 10.

Figure 3:
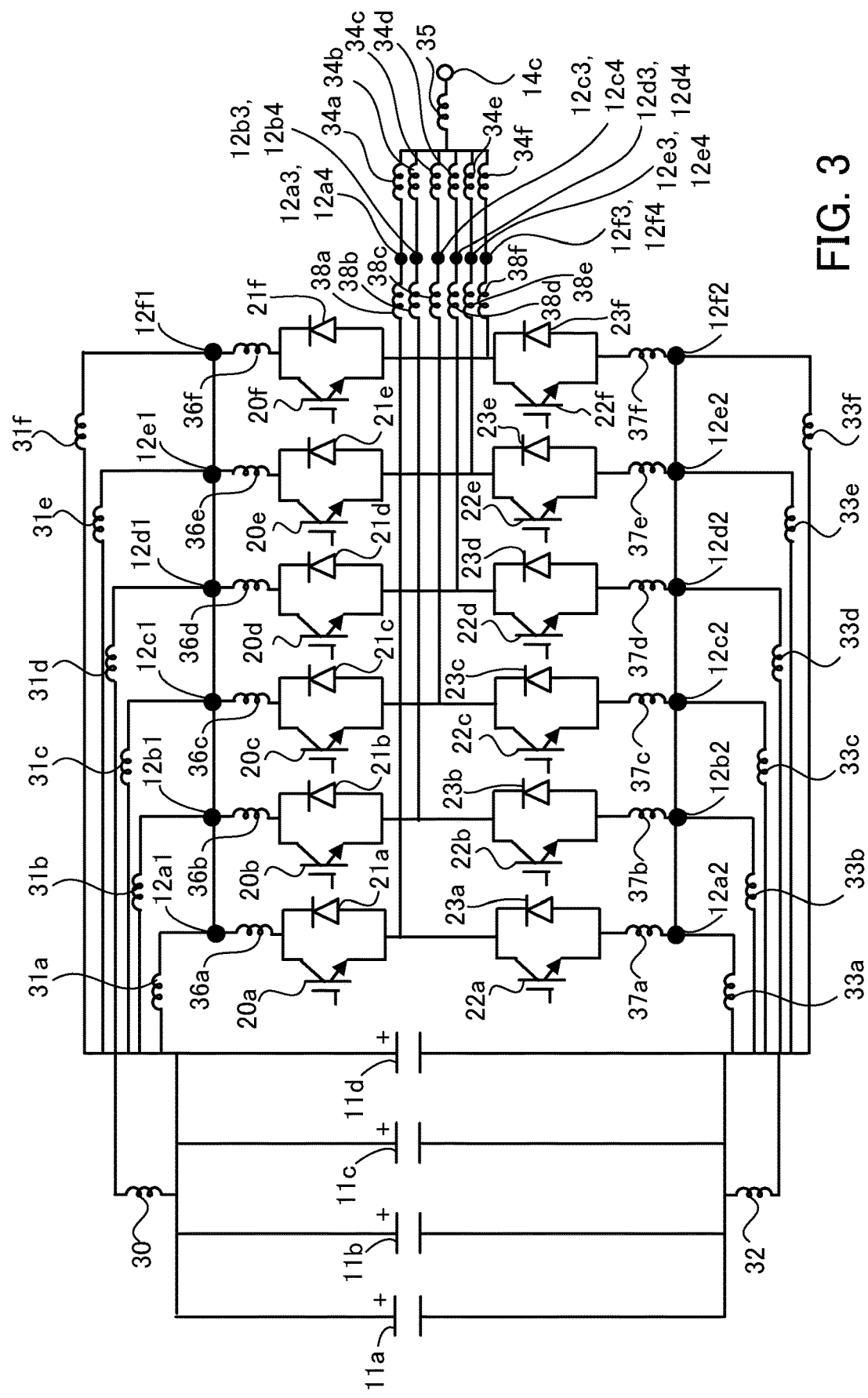
FIG. 3 illustrates an example of an equivalent circuit of the semiconductor unit according to the first embodiment.

FIG. 3 illustrates an example of an equivalent circuit of the semiconductor unit according to the first embodiment.

Each of the semiconductor modules 12a through 12f illustrated in FIG. 1 has an upper arm and a lower arm each including an IGBT and a diode.

The semiconductor module 12a includes IGBTs 20a and 22a and diodes 21a and 23a and the semiconductor module 12b includes IGBTs 20b and 22b and diodes 21b and 23b. The semiconductor module 12c includes IGBTs 20c and 22c and diodes 21c and 23c and the semiconductor module 12d includes IGBTs 20d and 22d and diodes 21d and 23d. The semiconductor module 12e includes IGBTs 20e and 22e and diodes 21e and 23e and the semiconductor module 12f includes IGBTs 20f and 22f and diodes 21f and 23f.

In the semiconductor module 12a, a collector of the IGBT 20a and a cathode of the diode 21a are connected to the positive terminal 12a1. An emitter of the IGBT 20a and an anode of the diode 21a are connected to the first output terminals 12a3 and 12a4, a collector of the IGBT 22a, and a cathode of the diode 23a. An emitter of the IGBT 22a and an anode of the diode 23a are connected to the negative terminal 12a2. The same circuit structure is adopted in the semiconductor modules 12b through 12f.

A gate control circuit (not illustrated) is connected to gates of the IGBTs 20a through 20f included in the upper arms and the IGBTs 20a through 20f are turned on or off at the same timing. A gate control circuit (not illustrated) is also connected to gates of the IGBTs 22a through 22f included in the lower arms and the IGBTs 22a through 22f are turned on or off at timing having a phase opposite to that of timing at which the IGBTs 20a through 20f are turned on or off.

In the equivalent circuit of FIG. 3, the wiring inductance of each portion is indicated.

As illustrated in FIG. 1 and FIG. 2, the slits 13a1 through 13a5 are cut. By doing so, a wiring inductance between the capacitors 11a through 11d and the positive terminals 12a1 through 12f1 is divided into wiring inductances 30, 31a, 31b, 31c, 31d, 31e, and 31f. The wiring inductance 30 is the wiring inductance of a portion of the first conductor 13a in which a slit is not cut and which has a large wiring width. The wiring inductances 31a through 31f are the wiring inductances of portions of the first conductor 13a partitioned with the slits 13a1 through 13a5 and each having a small wiring width.

For example, the wiring inductance 31a is the wiring inductance of a portion of the first conductor 13a between a left edge portion and the slit 13a1. The wiring inductance 31b is the wiring inductance of a portion of the first conductor 13a between the slits 13a1 and 13a2.

Similarly, as illustrated in FIG. 1 and FIG. 2, the slits 13b1 through 13b5 are cut. By doing so, a wiring inductance between the capacitors 11a through 11d and the negative terminals 12a2 through 12f2 is divided into wiring inductances 32, 33a, 33b, 33c, 33d, 33e, and 33f. The wiring inductance 32 is the wiring inductance of a portion of the second conductor 13b in which a slit is not cut and which has a large wiring width. The wiring inductances 33a through 33f are the wiring inductances of portions of the second conductor 13b partitioned with the slits 13b1 through 13b5 and each having a small wiring width.

For example, the wiring inductance 33a is the wiring inductance of a portion of the second conductor 13b between a left edge portion and the slit 13b1. The wiring inductance 33b is the wiring inductance of a portion of the second conductor 13b between the slits 13b1 and 13b2.

In addition, a wiring inductance between the first output terminals 12a3 and 12a4 through 12f3 and 12f4 and the second output terminal 14c is divided into wiring inductances 34a, 34b, 34c, 34d, 34e, 34f and 35. The wiring inductances 34a through 34f are the wiring inductances of the connecting portions 14a1 through 14a6, respectively, of the output wiring 14 and the wiring inductance 35 is the wiring inductance of the intermediate portion 14b of the output wiring 14.

In FIG. 3, wiring inductances in the semiconductor modules 12a through 12f are also indicated. Wiring inductances 36a, 36b, 36c, 36d, 36e, and 36f are the wiring inductances of wirings between the upper arms of the semiconductor modules 12a through 12f and the positive terminals 12a1 through 12f1, respectively. Wiring inductances 37a, 37b, 37c, 37d, 37e, and 37f are the wiring inductances of wirings between the lower arms of the semiconductor modules 12a through 12f and the negative terminals 12a2 through 12f2, respectively. Wiring inductances 38a, 38b, 38c, 38d, 38e, and 38f are the wiring inductances of wirings between the upper and lower arms of the semiconductor modules 12a through 12f and the first output terminals 12a3 and 12a4 through 12f3 and 12f4.

As illustrated in FIG. 1 and FIG. 2, the slits 13a1 through 13a5 and 13b1 through 13b5 are cut. By doing so, values of wiring inductances between the capacitors 11a through 11d and the semiconductor modules 12a through 12f are approximately the same. The reason for this will now be explained.

The wiring inductance of the laminated wiring 13 is inversely proportional to wiring width and the distance between the first conductor 13a and the second conductor 13b. Accordingly, values of the wiring inductances 31a through 31f and 33a through 33f of the portions partitioned with the slits and each having a small wiring width are larger than values of the wiring inductances 30 and 32 of the portions in which a slit is not cut and which have a large wiring width. If the difference in wiring width between the portions having a large wiring width and the portions having a small wiring width is large, then values of wiring inductances between the capacitors 11a through 11d and the semiconductor modules 12a through 12f are approximately equal to values of the wiring inductances 31a through 31f and 33a through 33f. By cutting slits so as to make wiring widths partitioned with the slits approximately equal, values of the wiring inductances 31a through 31f and 33a through 33f are made approximately equal. As a result, values of wiring inductances between the capacitors 11a through 11d and the semiconductor modules 12a through 12f are made approximately equal. Variations in the total of inductance values from the terminals 11a1 through 11d1 to the positive terminals 12a1 through 12f1 nearest the terminals 11a1 through 11d1 and inductance values from the negative terminals 12a2 through 12f2 to the terminals 11a2 through 11d2 nearest the negative terminals 12a2 through 12f2 are made in this way smaller than or equal to 10 nH among the semiconductor modules 12a through 12f.

Because the totals of values of the wiring inductances 36a through 36f and values of the wiring inductances 37a through 37f are about 10 nH in the semiconductor modules 12a through 12f, respectively, variations are made smaller than or equal to 10 nH.

As long as variations are smaller than or equal to 10 nH, the position or shape of the slits 13a1 through 13a5 and 13b1 through 13b5 is not specially limited to that described in the above embodiment.

Furthermore, the above connecting portions 14a1 through 14a6 and intermediate portion 14b are included in the semiconductor unit 10 according to the first embodiment. As a result, values of wiring inductances between the second output terminal 14c and the semiconductor modules 12a through 12f are made approximately equal. The wiring width of the connecting portions 14a1 through 14a6 is smaller than that of the intermediate portion 14b, values of the wiring inductances 34a through 34f are greater than a value of the wiring inductance 35. If the difference in wiring width between the connecting portions 14a1 through 14a6 and the intermediate portion 14b is large, then values of wiring inductances between the second output terminal 14c and the semiconductor modules 12a through 12f are approximately equal to the values of the wiring inductances 34a through 34f. By forming the connecting portions 14a1 through 14a6 having the same wiring width, values of the wiring inductances 34a through 34f are made equal. As a result, values of wiring inductances between the second output terminal 14c and the semiconductor modules 12a through 12f are made approximately equal. Variations in inductance value from each of the connecting portions 14a1 through 14a6 to the second output terminal 14c are also made in this way smaller than or equal to 10 nH among the semiconductor modules 12a through 12f on the output side.

An example of the operation of the semiconductor unit 10 will be described.

When the IGBTs 20a through 20f included in the upper arms of the semiconductor modules 12a through 12f are turned on, currents flow from the capacitors 11a through 11d, through the semiconductor modules 12a through 12f, to the second output terminal 14c. At this time, the currents flow via the wiring inductance 30, the wiring inductances 31a through 31f, the wiring inductances 36a through 36f, the wiring inductances 38a through 38f, the wiring inductances 34a through 34f, and the wiring inductance 35.

On the other hand, when the IGBTs 22a through 22f included in the lower arms of the semiconductor modules 12a through 12f are turned on, currents flow from the second output terminal 14c, through the semiconductor modules 12a through 12f, to the capacitors 11a through 11d. At this time, the currents flow via the wiring inductance 35, the wiring inductances 34a through 34f, the wiring inductances 37a through 37f, the wiring inductances 33a through 33f, and the wiring inductance 32.

A voltage given by $$V = L \cdot di/dt$$

is generated in each wiring inductance due to a change in current at the time of switching.

A single-phase inverter is realized by the use of the two semiconductor units 10 and a three-phase inverter is realized by the use of the three semiconductor units 10.

As has been described, with the semiconductor unit 10 according to the first embodiment, wiring inductances between the capacitors 11a through 11d and the semiconductor modules 12a through 12f and wiring inductances between the semiconductor modules 12a through 12f and the second output terminal 14c are equal. As a result, a current flowing at the time of switching is divided equally among the semiconductor modules 12a through 12f.

Comparative Example

Figure 4:
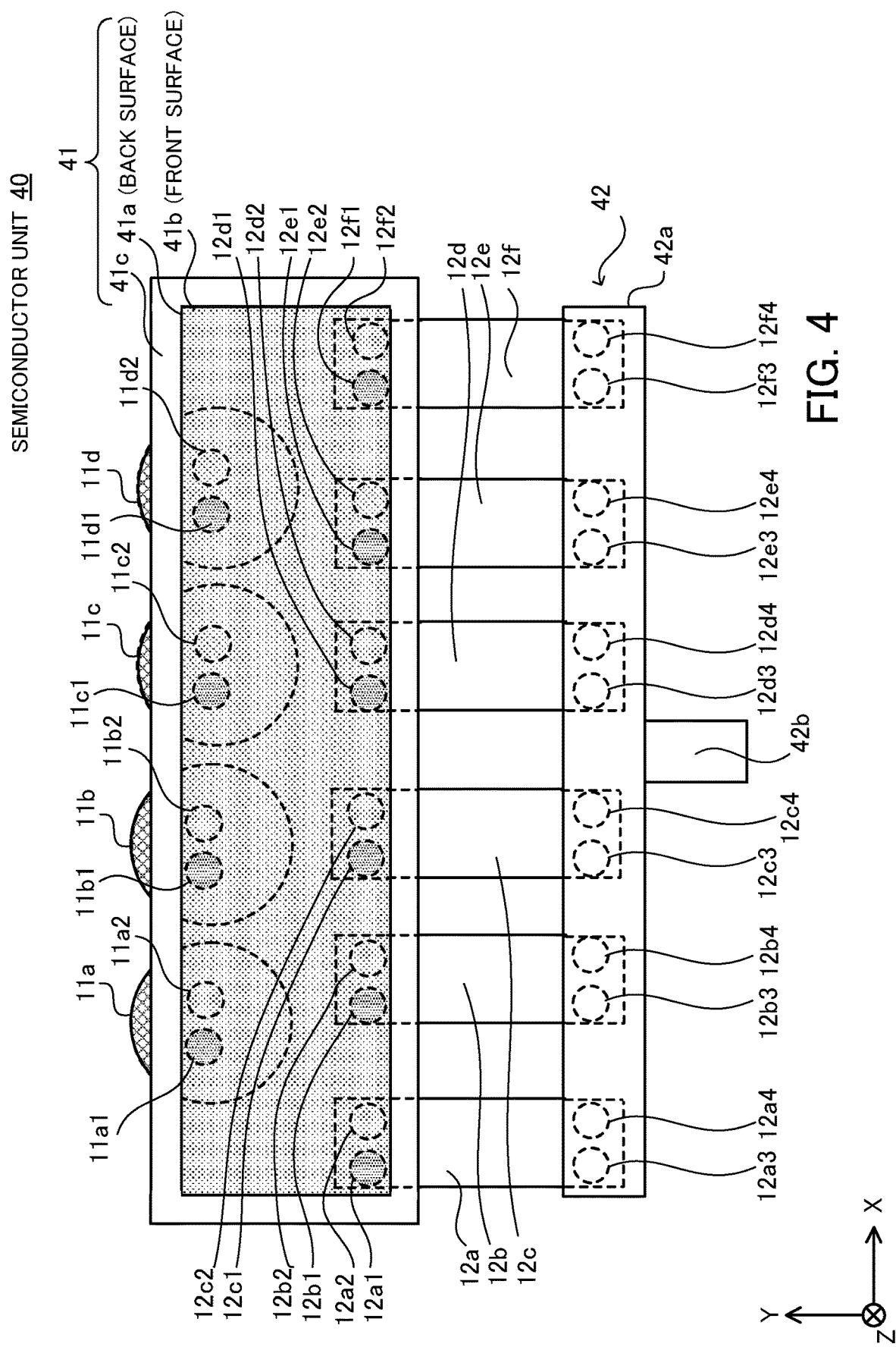
FIG. 4 is a plan view of a semiconductor unit taken as a comparative example.

FIG. 4 is a plan view of a semiconductor unit taken as a comparative example. Components in FIG. 4 which are the same as those illustrated in FIG. 1 are marked with the same numerals.

A semiconductor unit 40 taken as a comparative example includes a laminated wiring 41. The laminated wiring 41 has a first conductor 41a on the back surface, a second conductor 41b on the front surface, and an insulator 41c between the first conductor 41a and the second conductor 41b with an area on the X-Y plane which is larger than that of the first conductor 41a and the second conductor 41b. This is the same with the semiconductor unit 10 according to the first embodiment. However, slits are not cut in the first conductor 41a or the second conductor 41b.

Furthermore, an output wiring 42 included in the semiconductor unit 40 taken as a comparative example has a common wiring 42a to which first output terminals 12a3 and 12a4 through 12f3 and 12f4 are connected and a second output terminal 42b connected to a central portion of the common wiring 42a. Unlike the semiconductor unit 10 according to the first embodiment, the output wiring 42 does not have connecting portions 14a1 through 14a6.

Figure 5:
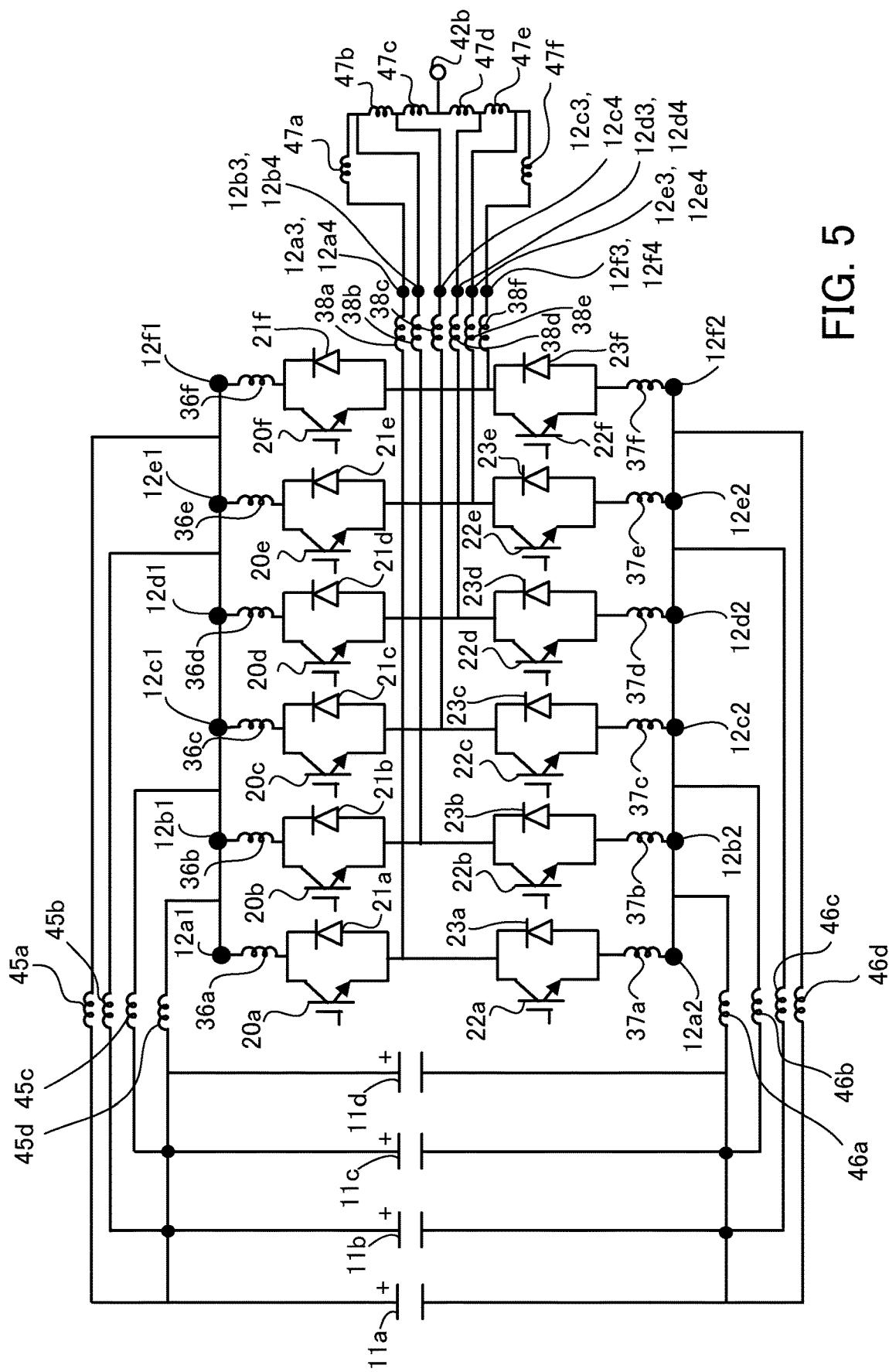
FIG. 5 illustrates an equivalent circuit of the semiconductor unit taken as a comparative example.

FIG. 5 illustrates an equivalent circuit of the semiconductor unit taken as a comparative example. Components in FIG. 5 which are the same as those illustrated in FIG. 3 are marked with the same numerals.

Wiring inductances 45a, 45b, 45c, and 45d are wiring inductances between capacitors 11a through 11d and positive terminals 12a1 through 12f1. Wiring inductances 46a, 46b, 46c, and 46d are wiring inductances between the capacitors 11a through 11d and negative terminals 12a2 through 12f2.

A wiring inductance 47a is a wiring inductance between the first output terminals 12a3 and 12a4 and the first output terminals 12b3 and 12b4. A wiring inductance 47b is a wiring inductance between the first output terminals 12b3 and 12b4 and the first output terminals 12c3 and 12c4. A wiring inductance 47c is a wiring inductance between the first output terminals 12c3 and 12c4 and the second output terminal 42b. A wiring inductance 47d is a wiring inductance between the second output terminal 42b and the first output terminals 12d3 and 12d4. A wiring inductance 47e is a wiring inductance between the first output terminals 12d3 and 12d4 and the first output terminals 12e3 and 12e4. A wiring inductance 47f is a wiring inductance between the first output terminals 12e3 and 12e4 and the first output terminals 12f3 and 12f4.

With the above semiconductor unit 40, values of the wiring inductances 45a through 45d are unequal and values of the wiring inductances 46a through 46d are also unequal. The reason for this is that the distances from the capacitors 11a through 11d to the positive terminals 12a1 through 12f1 and the distances from the capacitors 11a through 11d to the negative terminals 12a2 through 12f2 are unequal.

In addition, as described below, values of wiring inductances on the output side are also unequal. For example, wiring inductances between the first output terminals 12a3 and 12a4 of a semiconductor module 12a and the second output terminal 42b are the wiring inductances 47a, 47b, and 47c. On the other hand, a wiring inductance between the first output terminals 12c3 and 12c4 of a semiconductor module 12c and the second output terminal 42b is only the wiring inductance 47c. As a result, a current flowing through the semiconductor module 12c is larger than a current flowing through the semiconductor module 12a and a current flowing at the time of switching is divided unequally.

With the semiconductor unit 10 according to the first embodiment, unlike the above semiconductor unit taken as a comparative example, wiring inductances are made equal in the above way. Accordingly, a current flowing at the time of switching is divided equally among the semiconductor modules 12a through 12f. Furthermore, as a result, current derating (reduction in current set with heat generated due to a current imbalance taken into consideration) of each of the semiconductor modules 12a through 12f is decreased. Accordingly, when semiconductor modules with the same ratings are used, the rated current of the semiconductor unit 10 may be increased.

Modification

Figure 6:
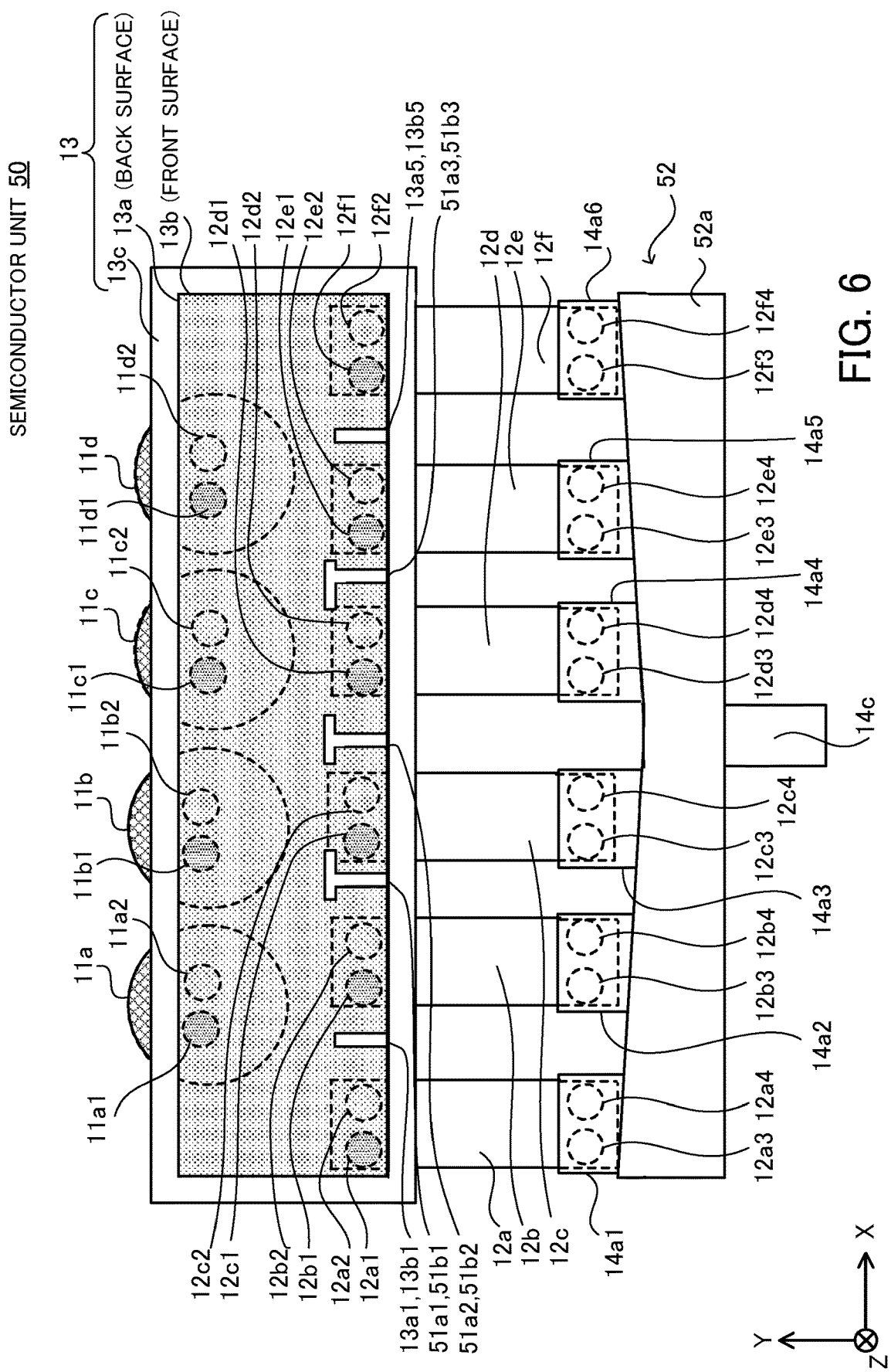
FIG. 6 is a plan view of a modification of the semiconductor unit according to the first embodiment.

FIG. 6 is a plan view of a modification of the semiconductor unit according to the first embodiment. Components in FIG. 6 which are the same as those illustrated in FIG. 1 are marked with the same numerals.

With a semiconductor unit 50 according to a modification, slits are cut so that as distance from capacitors 11a through 11d becomes shorter, at least one of the wiring width of a path of a first conductor 13a which connects terminals 11a1 through 11d1 and positive terminals 12a1 through 12f1 and the wiring width of a path of a second conductor 13b which connects terminals 11a2 through 11d2 and negative terminals 12a2 through 12f2 will become narrower. Accordingly, the shape of the slits differs from that of the slits in the semiconductor unit according to the first embodiment.

In the example of FIG. 6, the distance between the positive terminals 12c1 and 12d1 and the capacitors 11a through 11d is shorter than the distance between the positive terminals 12a1 and 12f1 and the capacitors 11a through 11d. Accordingly, slits 51a1, 51a2, and 51a3 are cut so that the wiring width of a path of the first conductor 13a which connects the positive terminals 12c1 and 12d1 and the terminals 11a1 through 11d1 will become narrower than the wiring width of a path of the first conductor 13a which connects the positive terminals 12a1 and 12f1 and the terminals 11a1 through 11d1. Slits 13a1 and 13a5 have the shape of the letter "I," but the slits 51a1 through 51a3 have the shape of the letter "T".

Similarly, in the example of FIG. 6, the distance between the negative terminals 12c2 and 12d2 and the capacitors 11a through 11d is shorter than the distance between the negative terminals 12a2 and 12f2 and the capacitors 11a through 11d. Accordingly, slits 51b1, 51b2, and 51b3 are cut so that the wiring width of a path of the second conductor 13b which connects the negative terminals 12c2 and 12d2 and the terminals 11a2 through 11d2 will become narrower than the wiring width of a path of the second conductor 13b which connects the negative terminals 12a2 and 12f2 and the terminals 11a2 through 11d2. Slits 13b1 and 13b5 have the shape of the letter "I," but the slits 51b1 through 51b3 have the shape of the letter "T".

By cutting the slits in the above way, wiring width is set with distance from the capacitors 11a through 11d taken into consideration. This makes wiring inductances more equal.

Furthermore, with the semiconductor unit 50 according to the modification, an intermediate portion 52a of an output wiring 52 is formed so that as distance from a second output terminal 14c increases, wiring width becomes wider. As a result, the intermediate portion 52a having wiring width set with distance from the second output terminal 14c taken into consideration is connected to connecting portions 14a1 through 14a6. This makes wiring inductances more equal.

Second Embodiment

Figure 7:
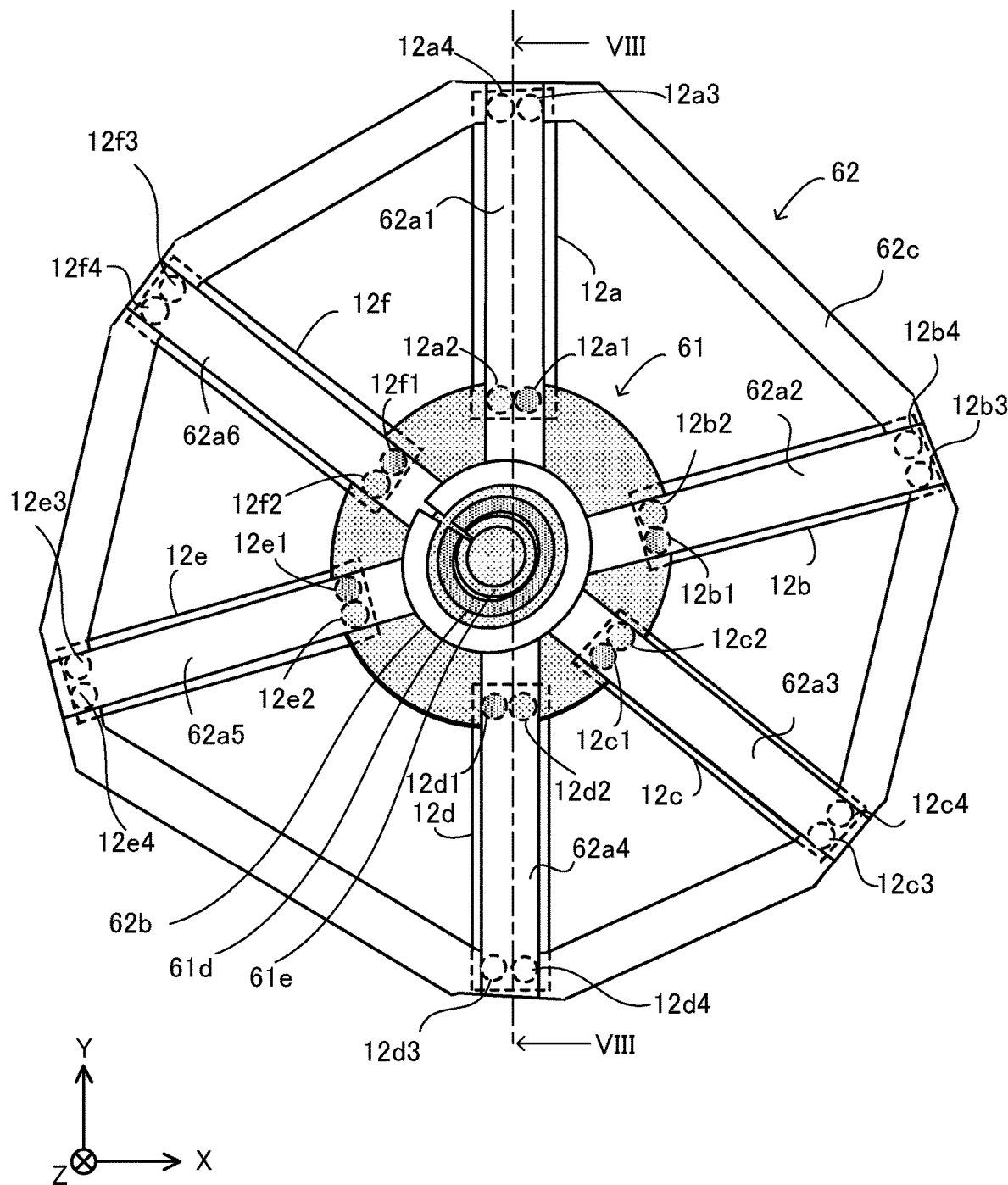
FIG. 7 is a plan view of a semiconductor unit according to a second embodiment.
Figure 8:
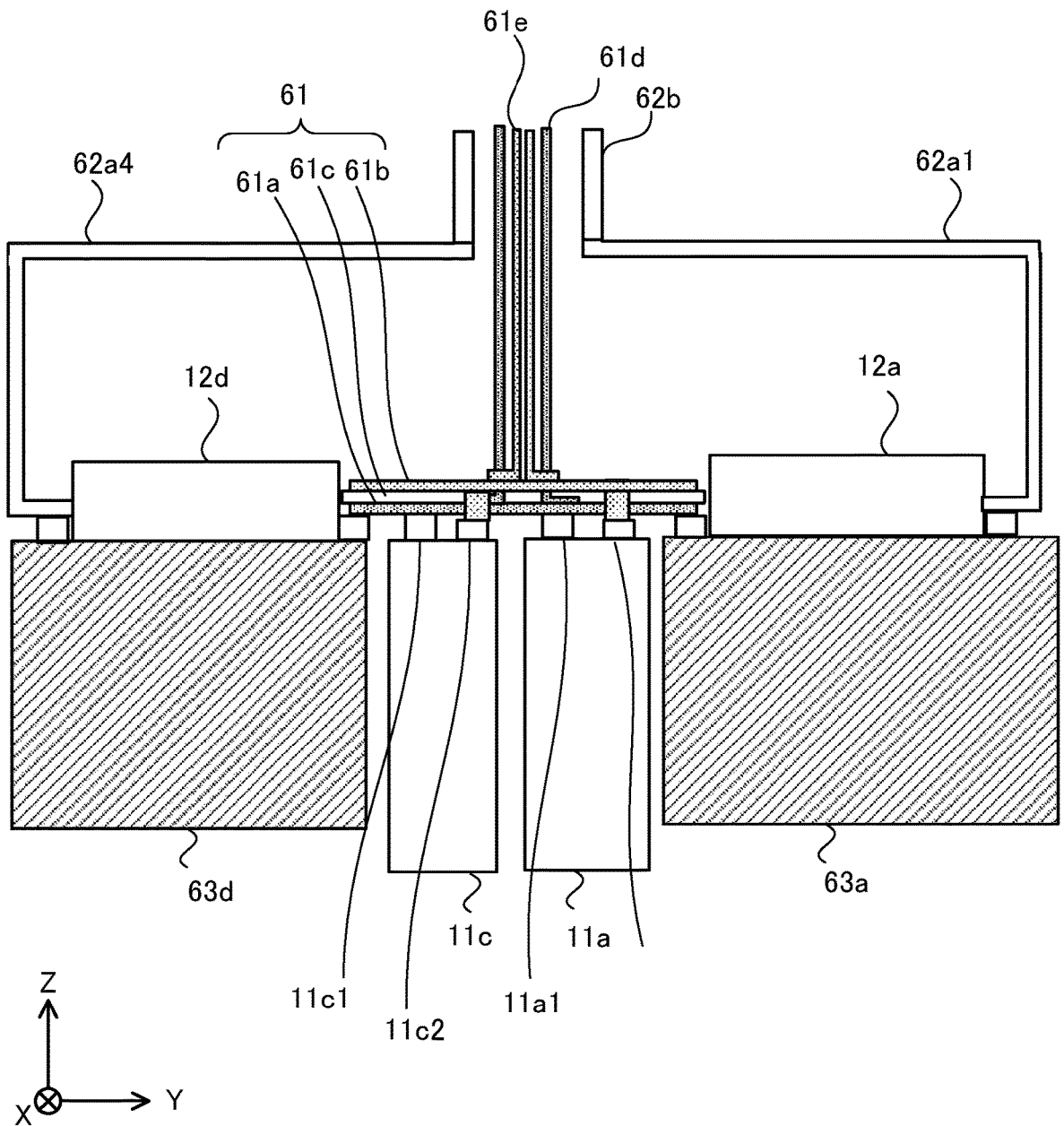
FIG. 8 is a sectional view taken along the line VIII-VIII of FIG. 7.
Figure 9:
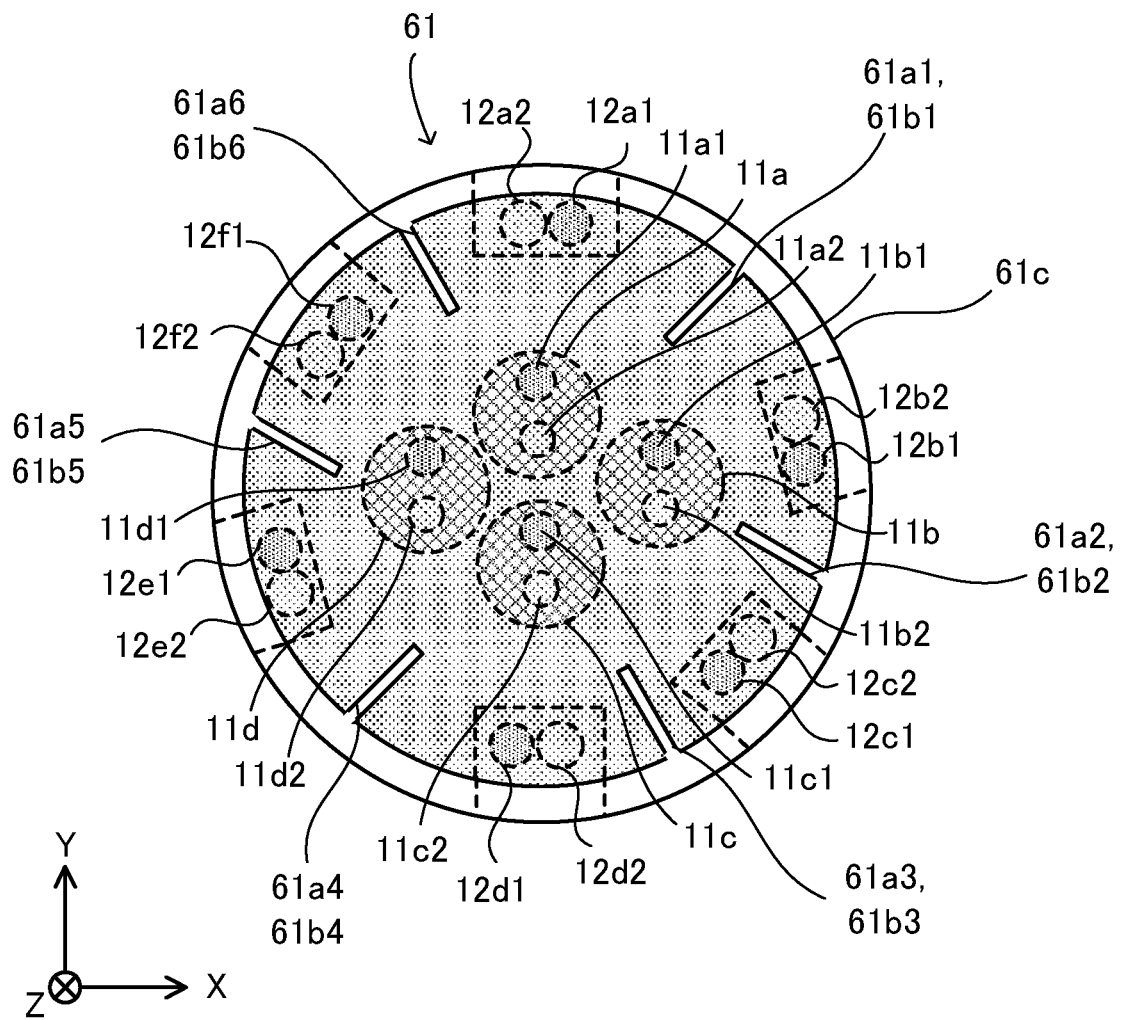
FIG. 9 is a plan view illustrative of connection between a capacitor and a laminated wiring.
Figure 10:
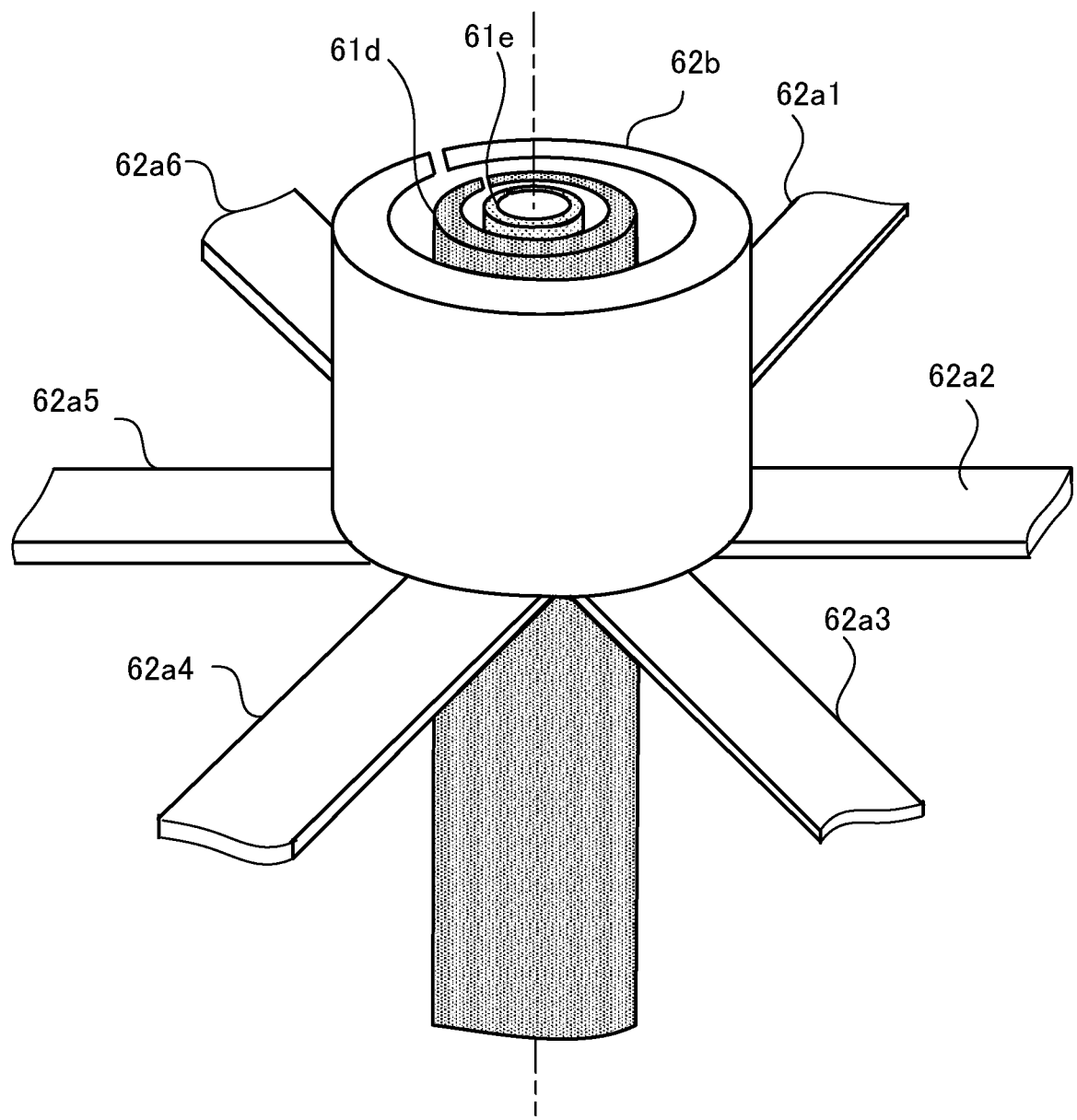
FIG. 10 is a perspective view illustrative of an example of a coaxial wiring portion.

FIG. 7 is a plan view of a semiconductor unit according to a second embodiment. Furthermore, FIG. 8 is a sectional view taken along the line VIII-VIII of FIG. 7. In addition, FIG. 9 is a plan view illustrative of connection between a capacitor and a laminated wiring. Moreover, FIG. 10 is a perspective view illustrative of an example of a coaxial wiring portion. Components in FIGS. 7 through 9 which are the same as those illustrated in FIG. 1 are marked with the same numerals.

As illustrated in FIG. 7, with a semiconductor unit 60 according to a second embodiment, semiconductor modules 12a through 12f are circularly arranged in plan view. As illustrated in FIG. 7 and FIG. 8, a laminated wiring 61 including a first conductor 61a, a second conductor 61b, and an insulator 61c is arranged in a central portion of the circle.

Cooling fins (for example, cooling fins 63a and 63d illustrated in FIG. 8) are located on the lower surfaces of the semiconductor modules 12a through 12d.

As illustrated in FIG. 8 and FIG. 9, positive terminals 12a1 through 12f1 of the semiconductor modules 12a through 12f are electrically connected via the first conductor 61a arranged in the central portion of the circle to terminals 11a1 through 11d1 of capacitors 11a through 11d. Furthermore, negative terminals 12a2 through 12f2 of the semiconductor modules 12a through 12f are electrically connected via the second conductor 61b arranged in the central portion of the circle to terminals 11a2 through 11d2 of the capacitors 11a through 11d.

In addition, as illustrated in FIG. 9, slits are cut in the first conductor 61a and the second conductor 61b between the positive terminals and the negative terminals of the adjacent semiconductor modules. Slits 61a1, 61a2, 61a3, 61a4, 61a5, and 61a6 are cut in the first conductor 61a. Slits 61b1, 61b2, 61b3, 61b4, 61b5, and 61b6 are cut in the second conductor 61b. The slits 61b1 through 61b6 are superimposed in plan view over the slits 61a1 through 61a6, respectively.

In the example of FIG. 9, the capacitors 11a through 11d are arranged in the central portion of the circular laminated wiring 61. Accordingly, the length of wiring distance from the capacitors 11a through 11d to the positive terminals 12a1 through 12f1 or to the negative terminals 12a2 through 12f2 is approximately the same. As a result, variations in the values of wiring inductances are small among the semiconductor modules 12a through 12f. Accordingly, there is no need to cut slits. However, by cutting slits, variations in the values of wiring inductances are made smaller among the semiconductor modules 12a through 12f.

Furthermore, the laminated wiring 61 includes coaxial wiring portions 61d and 61e. The coaxial wiring portion 61d is connected to the circular first conductor 61a and the coaxial wiring portion 61e is connected to the circular second conductor 61b. The coaxial wiring portion 61e is located on the side of the inner periphery of the coaxial wiring portion 61d. An insulator may be located between the coaxial wiring portions 61d and 61e.

In addition, an output wiring 62 includes wiring portions 62a1, 62a2, 62a3, 62a4, 62a5, and 62a6 connected to first output terminals 12a3 and 12a4 through 12f3 and 12f4 of the semiconductor modules 12a through 12f, respectively, a coaxial wiring portion 62b, and a wiring portion 62c.

The wiring portions 62a1 through 62a6 are formed so as to extend in the direction of the central axis of the circle from the first output terminals 12a3 and 12a4 through 12f3 and 12f4 of the semiconductor modules 12a through 12f, respectively, and is connected to the coaxial wiring portion 62b.

As illustrated in FIG. 10, the central axis of the circle corresponds to the same axle of the coaxial wiring portion 62b and the coaxial wiring portions 61d and 61e. The coaxial wiring portion 62b is situated on the side of the outer peripheries of the coaxial wiring portions 61d and 61e of the laminated wiring 61.

The wiring portion 62c electrically connects the wiring portions 62a1 through 62a6. There is no need to locate the wiring portion 62c.

The wiring portions 62a1 through 62a6 of the above output wiring 62 have the same functions as the connecting portions 14a1 through 14a6 illustrated in FIG. 1 have. Furthermore, the coaxial wiring portion 62b functions as the intermediate portion 14b illustrated in FIG. 1. A component corresponding to the second output terminal 14c illustrated in FIG. 1 is not illustrated. However, this component is situated over the coaxial wiring portion 62b and is connected to, for example, an external power source which charges the capacitors 11a through 11d.

An equivalent circuit of the semiconductor unit 60 is approximately the same as that illustrated in FIG. 3. However, if the wiring portion 62c is located, then the first output terminals 12a3 and 12a4 through 12f3 and 12f4 illustrated in FIG. 3 are connected to the wiring portion 62c.

By locating the above output wiring 62, wiring distance to the second output terminal is made equal among the semiconductor modules 12a through 12f and variations in the values of wiring inductances are suppressed.

In addition, with the semiconductor unit 60 according to the second embodiment, the laminated wiring 61 includes the coaxial wiring portions 61d and 61e and the output wiring 62 includes the coaxial wiring portion 62b. Accordingly, electromagnetic field vibration caused by a high-frequency current at switching time is shielded with the coaxial wiring portion 62b. This also reduces EMI noise.

Modification

Figure 11:
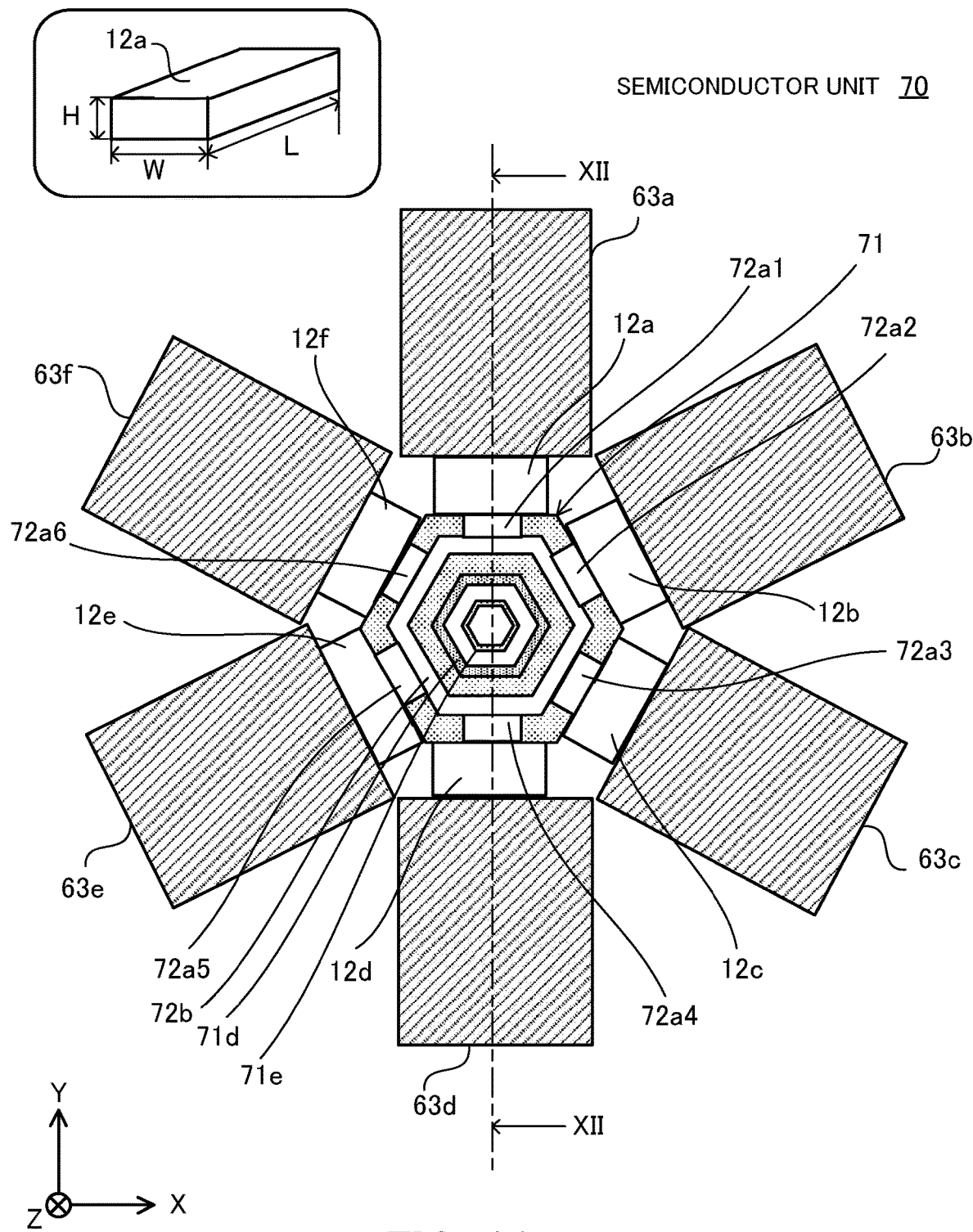
FIG. 11 is a plan view of a modification of the semiconductor unit according to the second embodiment.
Figure 12:
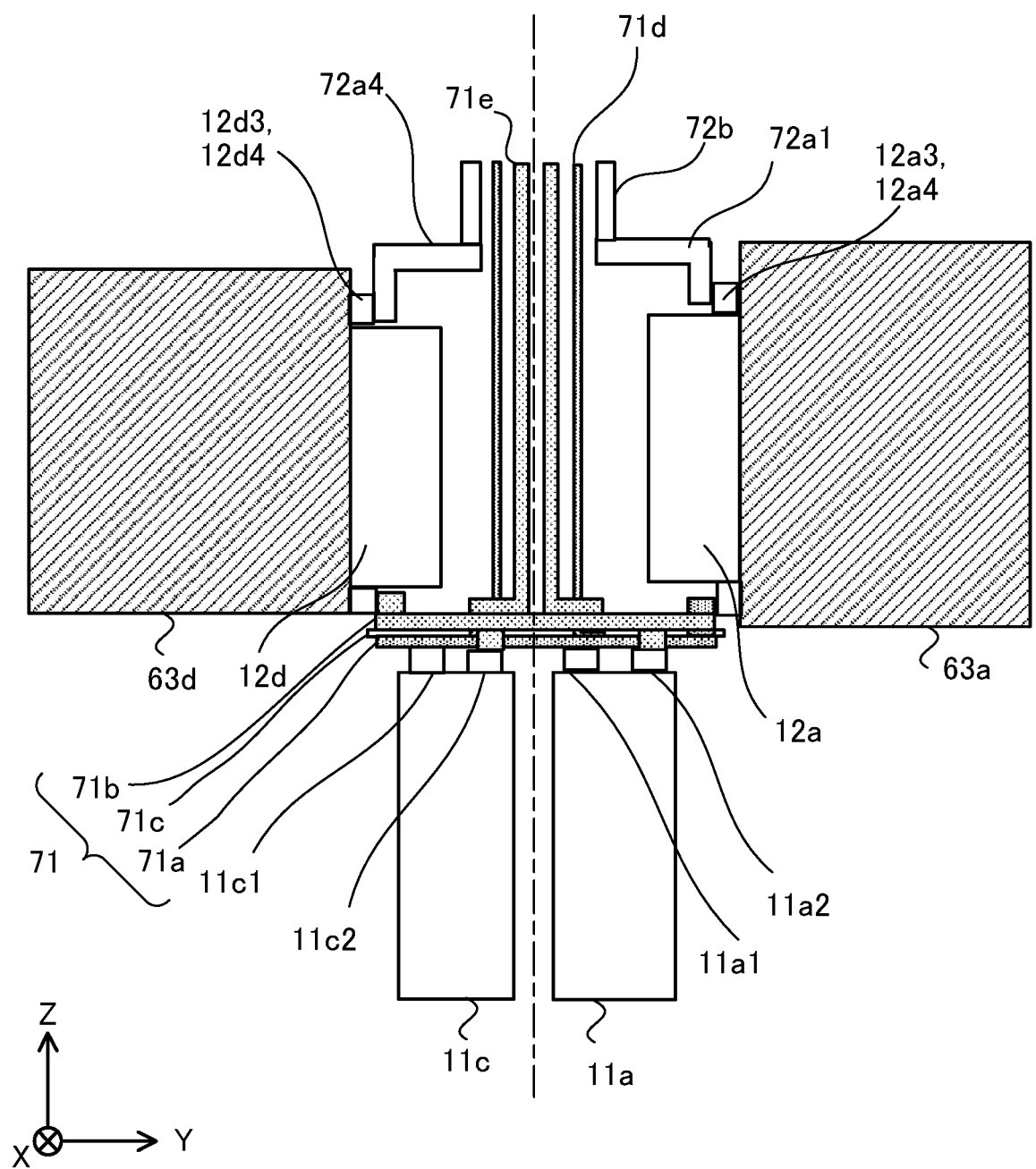
FIG. 12 is a sectional view taken along the line XII-XII of FIG. 11.

FIG. 11 is a plan view of a modification of the semiconductor unit according to the second embodiment. Furthermore, FIG. 12 is a sectional view taken along the line XII-XII of FIG. 11. Components in FIGS. 11 and 12 which are the same as those illustrated in FIG. 1 are marked with the same numerals.

With a semiconductor unit 70 according to a modification, semiconductor modules 12a through 12f are circularly arranged in plan view. This is the same with the semiconductor unit 60. However, the semiconductor modules 12a through 12f are arranged so that the longest side, of three sides indicative of height, length, and width, will be parallel to the central axis of the circle. FIG. 12 is a schematic view on the measurements of the semiconductor module 12a. In the example of FIG. 12, length L, of height H, length L, and width W, is the longest. Accordingly, the semiconductor module 12a is arranged so that a side indicative of L will be parallel to the central axis of the circle.

Furthermore, cooling fins 63a, 63b, 63c, 63d, 63e, and 63f are located on the outer peripheral side surfaces of the semiconductor modules 12a through 12f, respectively.

A laminated wiring 71 includes a first conductor 71a, a second conductor 71b, and an insulator 71c each of which is hexagonal in plan view. Connection between the first conductor 71a and the second conductor 71b and terminals of capacitors 11a through 11d and positive terminals and negative terminals of the semiconductor modules 12a through 12f is the same as that illustrated in FIG. 9. Slits like those illustrated in FIG. 9 may be cut in the first conductor 71a and the second conductor 71b.

In addition, the laminated wiring 71 includes coaxial wiring portions 71d and 71e each of which is hexagonal in plan view. The coaxial wiring portion 71d is connected to the first conductor 71a and the coaxial wiring portion 71e is connected to the second conductor 71b. The coaxial wiring portion 71e is located on the side of the inner periphery of the coaxial wiring portion 71d. An insulator may be located between the coaxial wiring portions 71d and 71e.

Moreover, an output wiring includes wiring portions 72a1, 72a2, 72a3, 72a4, 72a5, and 72a6 connected to first output terminals 12a3 and 12a4 through 12f3 and 12f4 (not illustrated in FIG. 12) of the semiconductor modules 12a through 12f, respectively, and a coaxial wiring portion 72b which is hexagonal in plan view.

The wiring portions 72a1 through 72a6 are formed so as to extend in the direction of the central axis of the circle from the first output terminals 12a3 and 12a4 through 12f3 and 12f4 of the semiconductor modules 12a through 12f, respectively, and is connected to the coaxial wiring portion 72b.

As illustrated in FIG. 11 and FIG. 12, the central axis of the circle corresponds to the same axle of the coaxial wiring portion 72b and the coaxial wiring portions 71d and 71e. The coaxial wiring portion 72b is situated on the side of the outer peripheries of the coaxial wiring portions 71d and 71e of the laminated wiring 71.

With the above semiconductor unit 70 according to the modification, the same effect that is obtained by the semiconductor unit 60 is also achieved. Furthermore, with the semiconductor unit 70, the semiconductor modules 12a through 12f are arranged so that the longest side, of three sides indicative of height, length, and width, will be parallel to the central axis of the circle. This reduces the size in the X direction and the Y direction of the semiconductor unit 70. In addition, in the example of FIG. 11 and FIG. 12, the first output terminals 12a3 and 12a4 through 12f3 and 12f4 of the semiconductor modules 12a through 12f may be brought close to one another. This reduces the length of the output wiring.

An aspect of the semiconductor unit according to the present disclosure has been described on the basis of the embodiments. However, these embodiments are simple examples and the present disclosure is not limited to the above description.

According to the disclosed technique, a current at switching time is equally divided among semiconductor modules connected in parallel.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor unit, comprising:
one or more capacitors each having a first capacitor terminal and a second capacitor terminal;

a plurality of semiconductor modules each having a positive terminal, a negative terminal, and a first output terminal;

a laminated wiring having a first conductor which connects the first capacitor terminal of each of the one or more capacitors to the plurality of positive terminals, a second conductor which connects the second capacitor terminal of each of the one or more capacitors to the plurality of negative terminals, and an insulator which is disposed between the first conductor and the second conductor and insulates the first conductor and the second conductor from each other, the laminated wiring having a plurality of slits in one of the first conductor and the second conductor so that a variation in a total of first and second inductance values among the plurality of semiconductor modules is smaller than or equal to 10 nH, the first inductance values being respective inductance values between each first capacitor terminal of the one or more capacitors and one positive terminal that is closest to said each first capacitor terminal, the second inductance values being respective inductance values between each one of the plurality of negative terminals and one second capacitor terminal that is closest to said each one of the plurality of negative terminals; and an output wiring having a plurality of connecting portions respectively connected to a respective one of the first output terminals of the plurality of semiconductor modules, a second output terminal and an intermediate portion electrically connecting the plurality of connecting portions to the second output terminal.

2. The semiconductor unit according to claim 1, wherein:
the laminated wiring further has a plurality of slits in the other one of the first conductor and the second conductor; and
the plurality of slits in the second conductor are respectively superimposed in a plan view of the semiconductor unit over respective ones of the plurality of slits in the first conductor.

3. The semiconductor unit according to claim 1, wherein the plurality of slits are provided such that at least one of a width of a wiring path connecting the first capacitor terminal of one of the one or more capacitors to the positive terminal of one of the plurality of semiconductor modules and being formed in the first conductor or a width of a wiring path connecting the second capacitor terminal of the one of the one or more capacitors to the negative terminal of the one of the plurality of semiconductor modules and being formed in the second conductor narrows with decreasing distance between the one of the one or more capacitors and the one of the plurality of semiconductor modules.

4. The semiconductor unit according to claim 1, wherein a variation in inductance values between the second output terminal and respective ones of the plurality of connecting portions is smaller than or equal to 10 nH.

5. The semiconductor unit according to claim 1, wherein the intermediate portion has a shape such that a width thereof widens with increasing distance from the second output terminal.

6. The semiconductor unit according to claim 1, wherein:
the plurality of semiconductor modules are circularly arranged to have a central axis;
the first conductor and the second conductor each are disposed at the central axis in a plan view of the semiconductor unit;
the positive terminal of each of the plurality of semiconductor modules is electrically connected to the first capacitor terminal of each of the one or more capacitors via the first conductor; and
the negative terminal of each of the plurality of semiconductor modules is electrically connected to the second capacitor terminal of each of the one or more capacitors via the second conductor.

7. The semiconductor unit according to claim 6, wherein the plurality of semiconductor modules each have three sides respectively extending in a height direction, a length direction, and a width direction of the semiconductor module, and having length respectively indicative of a height, a length and a width of the semiconductor module, and are each arranged such that a longest side among the three sides is parallel to the central axis.

8. The semiconductor unit according to claim 6, wherein the plurality of connecting portions of the output wiring each extend toward the central axis from the first output terminal of each of the plurality of semiconductor modules.

9. The semiconductor unit according to claim 6, wherein each of the output wiring and the laminated wiring includes a coaxial wiring portion, a center of which is positioned at the central axis in the plan view.

* * * * *